US011820239B1

(12) United States Patent
Morava

(10) Patent No.: US 11,820,239 B1
(45) Date of Patent: Nov. 21, 2023

(54) SYSTEM AND METHOD FOR MITIGATION OF INTRUSIVE ELECTROMAGNETIC FIELDS

(71) Applicant: Jan Morava, Markham (CA)

(72) Inventor: Jan Morava, Markham (CA)

( * ) Notice: Subject to any disclaimer, the term of this patent is extended or adjusted under 35 U.S.C. 154(b) by 0 days.

(21) Appl. No.: 17/813,776

(22) Filed: Jul. 20, 2022

(51) Int. Cl.
    *B60L 5/38*     (2006.01)
    *H05K 9/00*     (2006.01)
    *H05K 7/14*     (2006.01)
    *H05K 7/18*     (2006.01)

(52) U.S. Cl.
    CPC .............. *B60L 5/38* (2013.01); *H05K 9/0001* (2013.01); *H05K 9/0071* (2013.01); *B60L 2200/26* (2013.01)

(58) Field of Classification Search
    CPC ..... B60L 5/38; B60L 2200/26; H05K 9/0001; H05K 9/0071; H05K 7/14; H05K 7/18; H05K 9/00; A61B 90/04; A61N 1/16; A61N 1/323; A61N 2/00; A61N 2/02; A61N 2/06; G21B 1/057; Y02E 30/10
    USPC ......... 381/800; 376/136, 142, 146; 128/897; 600/9
    See application file for complete search history.

(56) References Cited

U.S. PATENT DOCUMENTS

| 4,921,661 | A | * | 5/1990 | Leuer | G21B 1/057 |
| | | | | | 376/136 |
| 5,450,859 | A | * | 9/1995 | Litovitz | A61N 1/323 |
| | | | | | 128/897 |
| 2009/0307487 | A1 | * | 12/2009 | Mowva | G06F 21/57 |
| | | | | | 713/156 |
| 2015/0301084 | A1 | * | 10/2015 | Elliott | G01D 5/20 |
| | | | | | 324/207.2 |
| 2018/0115583 | A1 | * | 4/2018 | Lewis | H04L 63/1475 |

FOREIGN PATENT DOCUMENTS

| GB | 2347225 A | * | 8/2000 | ........... G01R 22/066 |
| JP | 2003167038 | | 6/2003 | |
| RU | 2768302 C1 | * | 3/2022 | .............. B61L 25/06 |

OTHER PUBLICATIONS

Written Opinion of International Searching Authority for International Application No. PCT/CA2023/050883, dated Sep. 5, 2023, (3 pages).

* cited by examiner

*Primary Examiner* — Timothy J Thompson
*Assistant Examiner* — Guillermo J Egoavil
(74) *Attorney, Agent, or Firm* — Hartman Global IP Law; Domenica N. S. Hartman; Gary M. Hartman

(57) ABSTRACT

A system for at least partially preventing passage an intrusive electromagnetic field into an internal volume of a structure is provided. The system includes a plurality of shielding modules positionable adjacent one another on an exterior surface of the structure for covering at least a portion of the exterior surface. Each of the shielding modules including a sensor and a shielding coil positioned around the sensor. The sensor is configured to measure the intrusive electromagnetic field and generate a signal based on the measured field. The system further includes a control unit in communication with each of the shielding modules, the control unit controls supply of response currents to the coil based on the signal such that the coil radiates a counteracting electromagnetic field that at least partially prevents passage of the intrusive field into the internal volume of the structure.

18 Claims, 8 Drawing Sheets

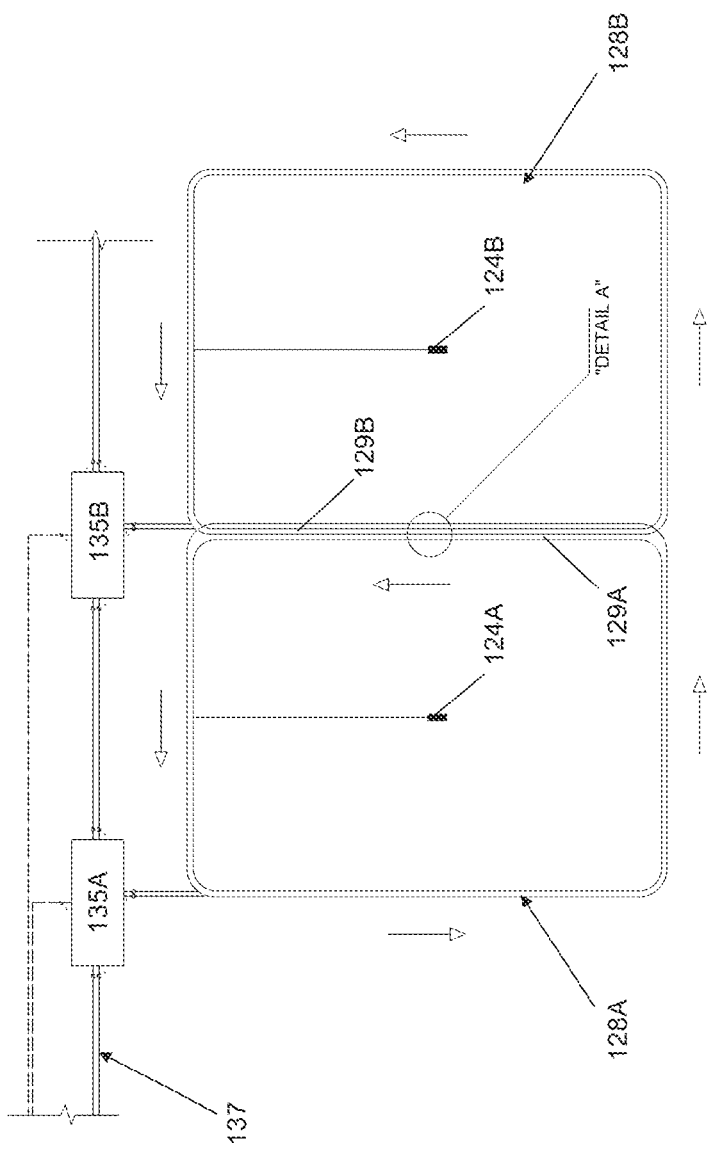
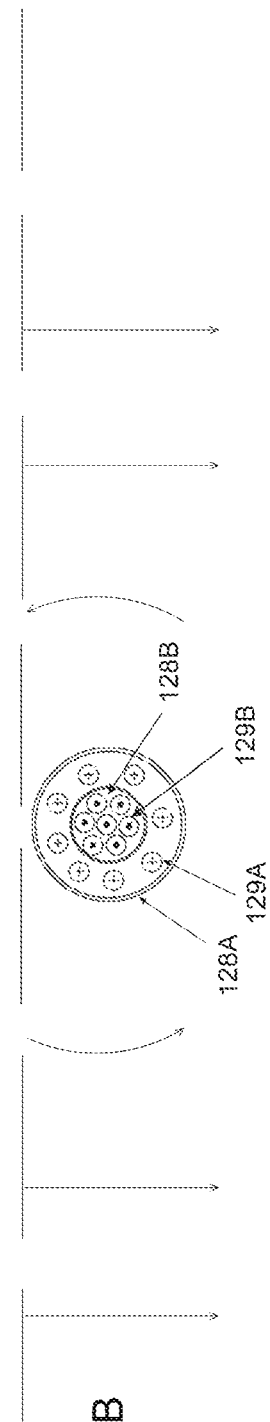
FIG. 6A
FIG. 6B

SYSTEM AND METHOD FOR MITIGATION OF INTRUSIVE ELECTROMAGNETIC FIELDS

TECHNICAL FIELD

The present disclosure generally relates to a system and method for mitigation of electromagnetic fields. More particularly, the present disclosure relates to a system and method for shielding a volume such as a structure or open space located in the vicinity of an electrified railroad or similar sources of interference from intrusive electromagnetic fields.

BACKGROUND

Electrically operated transportation systems such as trains and trams are one of the most efficient modes of transportation used around the world, however they are not without drawbacks. In general, all current carrying conductors radiate an electromagnetic field proportional to the magnitude of the current carried by the conductors, and electric traction systems are no exception. Electric traction systems are a source of electric, magnetic, and electromagnetic fields to which a significant proportion of the population may be exposed.

Electric train systems are subject to various standards and guidelines for limiting exposure to space and time-variant electric, magnetic, and electromagnetic fields. However, volumes such as buildings, playgrounds, school yards, and other structures and open spaces in the vicinity of electrified railroads are still exposed to higher electromagnetic field strengths than in other areas. These electromagnetic fields may also cause interference in the operation of electronic equipment and instruments, such as electron microscopes, magnetic resonance imaging (MRI) equipment, and computers. The negative effect of these electromagnetic fields on human health is also a concern.

The interference caused by these electromagnetic fields can be overcome by using either a passive shielding system or an active magnetic field cancellation system.

A passive shielding system typically involves using ferromagnetic layers on the surface of the structure being shielded. The ferromagnetic layers offer the magnetic field an alternative path of lower resistance and divert a portion of the magnetic field away from the protected area. The thickness of the shielding layer that is required to divert a sufficient portion of the magnetic field increases with the volume being shielded and it becomes exceedingly heavy, impractical, and expensive for use in shielding large buildings. Non-linear characteristics of the ferromagnetic material properties are also a limiting factor. For instance, the shielding effect is field strength-dependent, and the ferromagnetic material does not shield well when the field is too strong or too weak. This method is also not suitable for surfaces covered with glass as it blocks the main glass feature of transparency. A passive shielding system is also not suitable for protecting open spaces such as parks and children's playgrounds.

An active magnetic field cancellation system comprises mounting a set of orthogonal electrical coils and a magnetic field sensor around the area being protected. The magnetic field sensor measures the intrusive magnetic field, and the coils are supplied with a current to generate a magnetic field of the same magnitude but in the opposite direction to the intrusive magnetic field, thus effectively canceling the magnetic field in the area being shielded. This method is primarily used for protecting relatively small volumes such as electron microscopes and other highly sensitive instruments.

The active magnetic field cancellation system has the advantage of easy implementation; however, the shielding efficiency is limited. For instance, while the field strength at the location of the sensor may be maintained within the allowable limit, the rest of the space experiences either over-compensation or under-compensation conditions. When this method is applied to shield a large structure like a commercial or residential building from intrusive magnetic fields, the magnetic field strength is effectively mitigated in only a limited portion of the structure where the sensor is positioned.

A partial solution to this non-homogeneity in the magnetic field control may be the use of a system of concentric coils. This method may provide satisfactory results when the spatial profile of the intrusive electromagnetic field is known and constant, such as when the source of the electromagnetic field is from power transmission lines. However, this method would not provide satisfactory field attenuation and field homogeneity in the case of a time-variant and spatially variant magnetic field, such as electromagnetic fields radiating from passing electric trains.

Accordingly, there is a need for a system and method for preventing electromagnetic field interference in buildings located near electrified railroads, or similar external D.C. or A.C. magnetic field sources with changing field geometry and temporal profile.

SUMMARY

The present disclosure generally relates to a system and method for mitigation of electromagnetic fields. More particularly, the present disclosure relates to a system and method for shielding a volume such as a structure or open space located in the vicinity of an electrified railroad or similar sources of interference from intrusive electromagnetic fields.

In one aspect, there is provided a system for at least partially preventing passage of an intrusive electromagnetic field into an internal volume of a structure. The system includes a plurality of shielding modules positionable adjacent one another on an exterior surface of the structure for covering at least a portion of the exterior surface of the structure. Each of the plurality of shielding modules includes a sensor and a shielding coil positioned around the sensor. The sensor is configured to measure the intrusive electromagnetic field and generate a signal based on the measured intrusive electromagnetic field at the location of the sensor. The system further includes a central control unit in communication with each of the plurality of shielding modules, the central control unit configured to control supply of response currents to the shielding coil of each of the plurality of shielding modules based on the signal received from a respective sensor such that the shielding coil radiates a counteracting electromagnetic field that at least partially prevents passage of the intrusive electromagnetic field into the internal volume of the structure.

In one aspect, the sensor of each shielding module of the plurality of shielding modules is configured to continuously measure the intrusive electromagnetic field at the location of the sensor and to continuously generate the signal based on the continuously measured electromagnetic field and the central control unit is configured to continuously control supply of the response current to the shielding coil based on the signal received from the respective sensor such that the shielding coil continuously radiates the counteracting electromagnetic field that at least partially prevents passage of the intrusive electromagnetic field into the internal volume of the structure. In another aspect, the sensor is a flux-gate sensor or a Hall-effect sensor. In a further aspect, the sensor is positioned at a center of the shielding coil.

In one aspect, the shielding coil of each of the plurality of shielding modules is connected to a respective coil power supply unit, and in response to instructions from the central control unit, the respective coil power supply unit supplies the response currents to the shielding coil.

In one aspect, the counteracting electromagnetic field radiated by the shielding coil is substantially equal in magnitude to the intrusive electromagnetic field. In a further aspect, the counteracting electromagnetic field is radiated in an opposite direction to the intrusive electromagnetic field.

In a further aspect, the shielding coil of each of the plurality of shielding modules is mounted on a ferromagnetic back plate resistant to passage of electromagnetic field radiation therethrough.

In another aspect, the plurality of shielding modules comprises a first shielding module, the first shielding module comprising a first shielding coil having a first leg; and a second shielding module, the second shielding module comprising a second shielding coil having a second leg. The first shielding coil is positionable adjacent to the second shielding coil such that the first leg of the first shielding coil and the second leg of the second shielding coil are arranged coaxially.

In one aspect, the structure is a building and the plurality of shielding modules are positionable on at least one of a wall, a roof, and a lowest floor of the building. In a further aspect, the intrusive electromagnetic measured by each shielding module of the plurality of shielding modules originates from at least one electric system in proximity of the building.

In another aspect, there is provided a system for shielding a building from an intrusive electromagnetic field. The system includes a plurality of shielding modules positioned on a wall of the building adjacent one another for covering at least a portion of the wall of the building, each of the plurality of shielding modules including a sensor and a shielding coil positioned around the sensor. The sensor is configured to measure the intrusive electromagnetic field at the location of the sensor and generate a signal based on the measured intrusive electromagnetic field. The system further includes a central control unit positioned on the building and in communication with each of the plurality of shielding modules. The central control unit is configured to control supply of response currents to the shielding coil of each of the plurality of shielding modules based on the signal received from a respective sensor such that the shielding coil radiates a counteracting electromagnetic field that at least partially prevents passage of the intrusive electromagnetic field into an interior volume of the building. In one aspect, the plurality of shielding modules is further positioned on at least one of a second wall, a roof, and a lowest floor of the building. In a further aspect, the intrusive electromagnetic field measured by each shielding module of the plurality of shielding modules originates from at least one electric system in proximity of the building.

In one aspect, the sensor of each shielding module of the plurality of shielding modules is configured to continuously measure the intrusive electromagnetic field and to continuously generate the signal based on the continuously measured electromagnetic field. In a further aspect, the central control unit is configured to continuously control supply of the response currents to the shielding coil of each of the plurality of shielding modules based on the signal received from the respective sensor such that the shielding coil continuously radiates the counteracting electromagnetic field that at least partially prevents passage of the intrusive electromagnetic field into an interior volume of the building.

In one aspect, the sensor is configured to measure at least one of a magnitude and a direction of the intrusive electromagnetic field and to generate a signal based on the measurement of the at least one of the magnitude and the direction of the intrusive electromagnetic field in real-time and the central control unit is configured to control the supply of the response currents to the shielding coil in real-time. In a further aspect, the shielding coil of each of the plurality of shielding modules is connected to a respective coil power supply unit, and in response to instructions from the central control unit, the respective coil power supply unit supplies the response currents to the shielding coil.

In one aspect, the sensor is positioned at a center of the shielding coil and the sensor is configured to measure the intrusive electromagnetic field at the location of the sensor. In a further aspect, the sensor is a flux-gate sensor or a Hall-effect sensor.

In a further aspect, the shielding coil of each of the plurality of shielding modules is mounted on a ferromagnetic back plate resistant to passage of electromagnetic field radiation therethrough.

In another aspect, the plurality of shielding modules comprises a first shielding module, the first shielding module comprising a first shielding coil having a first leg; and a second shielding module, the second shielding module comprising a second shielding coil having a second leg. The first shielding coil is positioned adjacent to the second shielding coil such that the first leg of the first shielding coil and the second leg of the second shielding coil are arranged coaxially.

In another aspect, there is provided a method for shielding a building from intrusive electromagnetic fields. The method includes mounting a plurality of shielding modules on a surface of the building, each of the plurality of shielding modules comprising a shielding coil positioned around a sensor. The method further includes measuring, by the sensor of each of the plurality of shielding modules, the intrusive electromagnetic field at a location of the sensor, and sending a signal from the sensor to a central control unit based on the measured intrusive electromagnetic field. The method further includes sending response currents to the shielding coil of each of the plurality of shielding modules based on the signal received from a respective sensor such that the shielding coil of each of the plurality of shielding modules radiates a counteracting electromagnetic field that at least partially prevents passage of the intrusive electromagnetic field into an interior volume of the building. In one aspect, the plurality of shielding modules is mounted on at least one of a wall, a roof, and a lowest floor of the building. In one aspect, the sensor is positioned at approximately a center of the shielding coil.

In one aspect, the method includes continuously measuring, by the sensor, the intrusive electromagnetic field at the location of the sensor, continuously sending the signal of each of the plurality of shielding modules from the sensor to the central control unit based on the measured intrusive electromagnetic field, and continuously sending the response currents to the shielding coil of each of the plurality of shielding modules based on the signal received from the respective sensor such that the shielding coil continuously radiates the counteracting electromagnetic field that at least partially prevents passage of the intrusive electromagnetic field into the interior volume of the building. In one aspect, the counteracting electromagnetic field radiated from the shielding coil is substantially equal in magnitude to the intrusive electromagnetic field. In a further aspect, the shielding coil radiates the counteracting electromagnetic field in an opposite direction to the intrusive electromagnetic field.

In another aspect, the step of measuring the intrusive electromagnetic field comprises measuring at least one of the magnitude and the direction of the electromagnetic field in real-time. In a further aspect, the method includes sending a response current to the shielding coil in real-time.

BRIEF DESCRIPTION OF THE DRAWINGS

Exemplary non-limiting aspects are described with reference to the accompanying drawings in which:

FIG. 6A is a diagram illustrating an arrangement of the shielding coils in accordance with one aspect of the present disclosure;

FIG. 6B is a sectional view of the shielding coils shown in FIG. 6A taken at Detail A in FIG. 6A;

DETAILED DESCRIPTION

Figure 1:
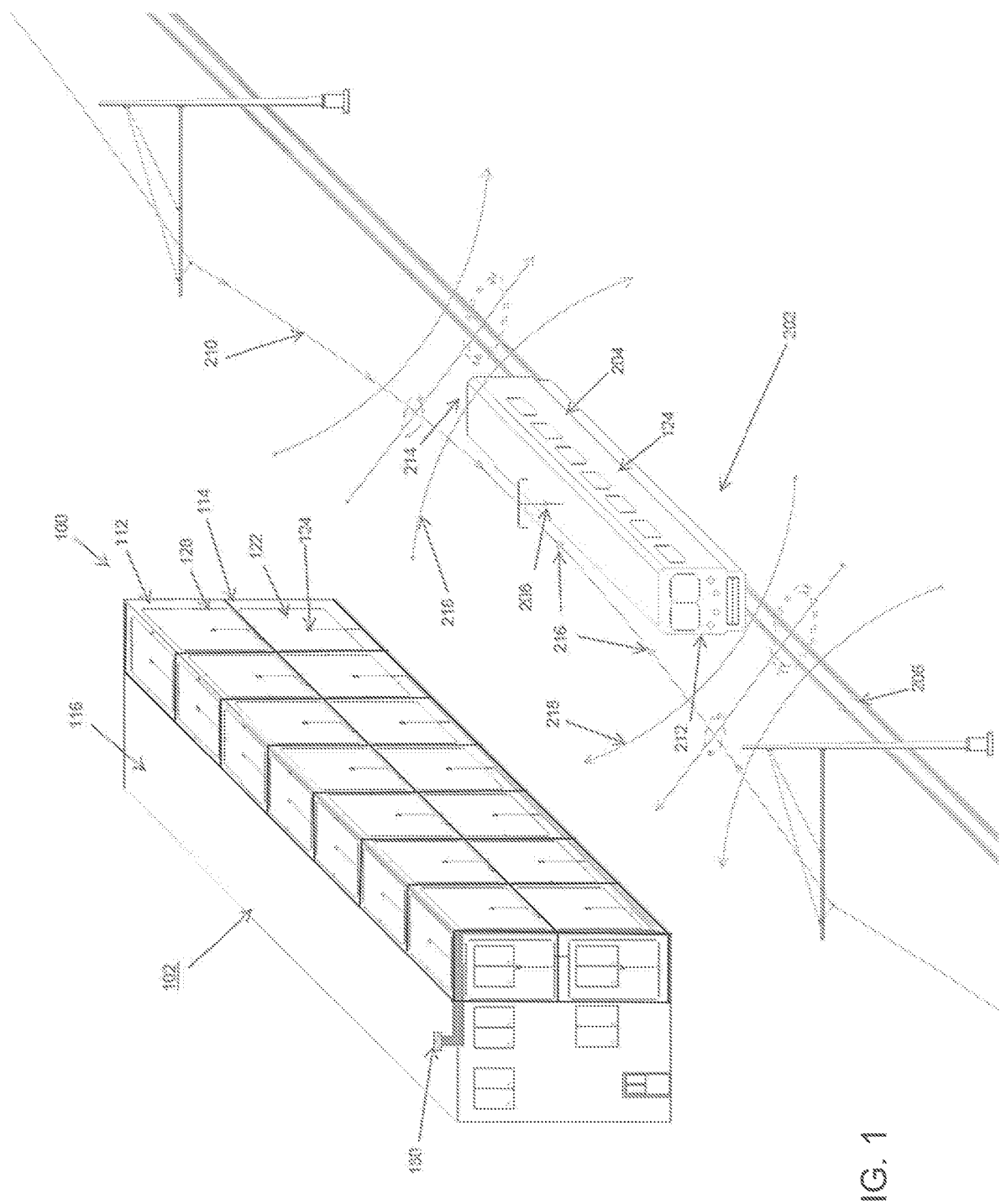
FIG. 1 is a perspective view of a system in accordance with one aspect of the present disclosure.

The present disclosure generally relates to a system and method for mitigation of electromagnetic fields. More particularly, the present disclosure relates to a system and method for shielding a volume such as a structure or open space located in the vicinity of an electrified railroad or similar sources of interference from intrusive electromagnetic fields.

A system for canceling or at least partially reducing intrusive or unwanted electromagnetic fields according to an aspect of the present invention includes a plurality of shielding modules mounted on an exterior surface of a building or structure to be protected. The system further includes a central control unit in communication with each shielding module of the plurality of shielding modules. A shielding coil and a magnetic field sensor are mounted on each shielding module of the plurality of shielding modules. The magnetic field sensors are configured to measure the magnetic interference field at the location of each of the individual magnetic field sensors and generate signals based on the measured electromagnetic field. Preferably, measurement of the magnetic interference field is done on a continuous basis and the generating of signals based on the measured electromagnetic field is also done on a continuous basis. The signals generated by the magnetic field sensors are sent to the central control unit. The central control unit is configured to process the signals received from the magnetic field sensors and further control a supply of proportional response currents to the shielding coils based on the signals received from the respective field sensors to generate a counteracting electromagnetic field that at least partially prevents passage of the unwanted electromagnetic field into the protected volume of the structure, preferably with a high degree of attenuation. Preferably, the counteracting electromagnetic field is radiated continuously in response to the signals generated from continuous measurement of the electromagnetic field. Also, it is preferable that the counteracting electromagnetic field is substantially equal in magnitude to the magnitude of the magnetic interference field. Likewise, it is preferred that the counteracting electromagnetic field is radiated in an opposite direction to the magnetic interference field. The central control unit is configured to control the supply of response currents by providing instructions to a power supply unit to send the proportional response currents to the shielding coils.

The present invention will now be described more fully hereinafter with reference to the accompanying drawings, in which preferred aspects of the present invention are shown. However, the present invention may be embodied in many different forms and should not be construed as limited to the aspects set forth herein. Rather, these aspects are provided so that this disclosure will be thorough and complete, and will fully convey the scope of the present invention to those skilled in the art. Like numbers refer to like elements throughout.

Figure 2:
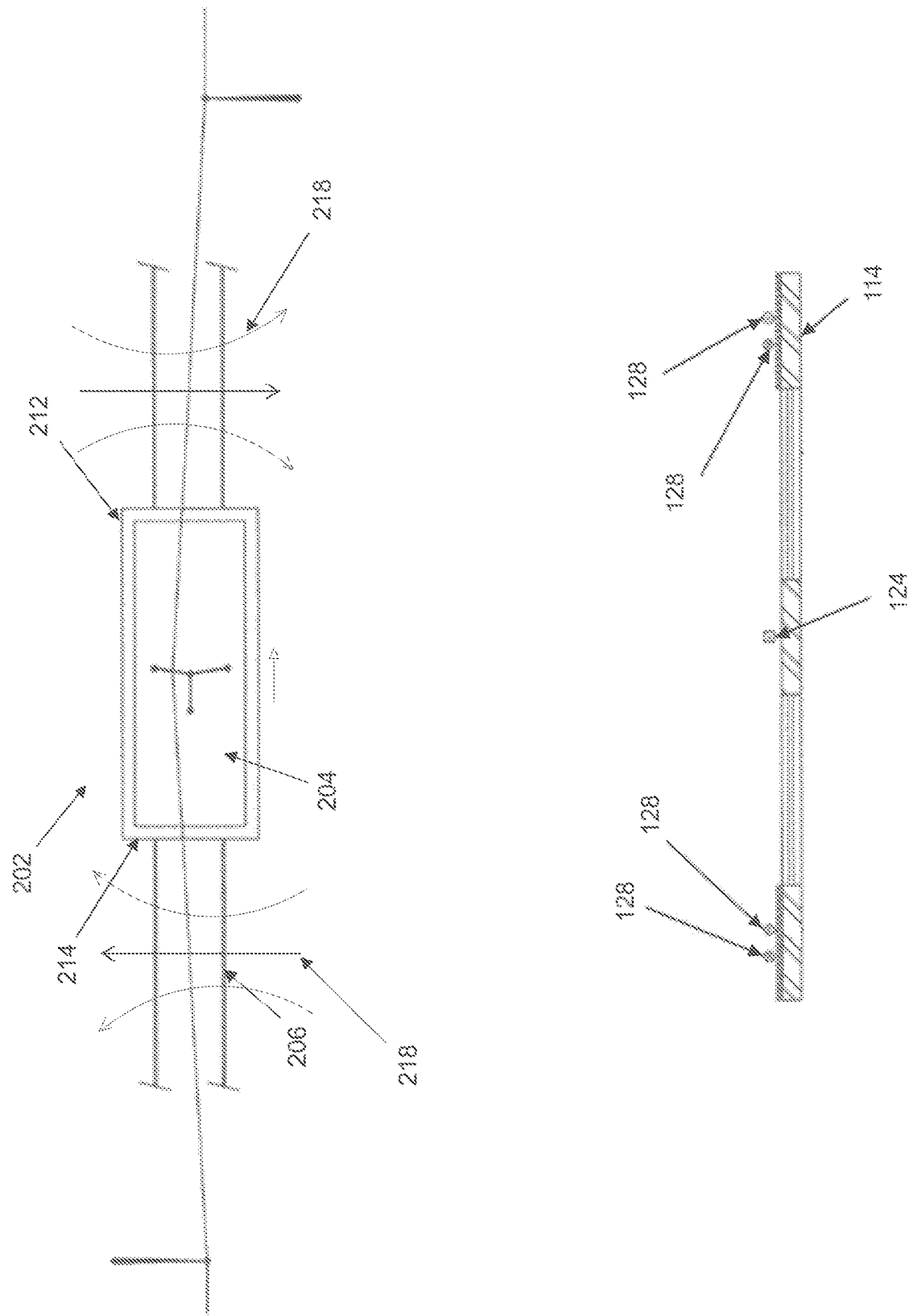
FIG. 2 is a plan view of the system shown in FIG. 1.

With reference to FIGS. 1 and 2, there is shown a system 100 for shielding large structures such as building 102 by eliminating or substantially reducing electromagnetic field radiation from nearby electric systems in proximity of the building 102, such as electrified railroad system 202. The electrified railroad system 202 includes an electric train 204 capable of travelling on a traction system, such as electrified railroad tracks 206 located in the vicinity of the building 102. Electrified railroad system 202 is supplied current via sliding contact 208 in sliding electrical contact with catenary 210 which is an overhead electrical line suspended over the railroad tracks 206 and extending generally parallel relative to the railroad tracks 206.

The current in the catenary wire 210 flows towards the train 204 from both the front 212 and back 214 of the train 204. In contrast, return current flows away from the train 204 from both the front 212 and back 214 of the train 204 via the railroad tracks 206. Current and its flow is shown in FIG. 1 using arrows or chevrons 216 along the catenary wire 210, sliding contact 208, train 204 and railroad tracks 206. Current in the catenary wire 210, the railroad tracks 206 and the electric train 204 generates magnetic fields 218 which radiate or are emitted outside of the catenary wire 210, the railroad tracks 206 and the electric train 204.

When no train 204 is present or when train 204 is stationary, a generally static magnetic field 218 is radiated from the electric railroad system 202. When in motion along track 206, train 204 creates a sudden change in the magnitude and direction (phase) of the magnetic field 218 relative to static components of the electric railroad system 202, namely the railroad tracks 206 and catenary wire 210. This sudden change is in addition to the more uniform magnetic field 218 from the catenary wire 210 and the rails 206.

Structure or building 102 is in the proximity the electrified railroad system 202 and so is affected by magnetic fields 218 generated by the currents in the catenary wire 210, the railroad tracks 206 and the electric train 204 and the changes therein when train 204 is in motion along the track 206. The system 100 is provided to actively shield structure or building 102 in the vicinity of the electrified railroad tracks 206 from the time-variant and spatially variant magnetic field 218.

The system 100 comprises a plurality of shielding modules 122 that may be positioned relative to an exterior surface of a building 102 to shield the building 102 from unwanted electromagnetic fields 218 originating from the electric train 204 travelling along the electrified railroad tracks 206.

The system 100 is positioned relative to an exterior surface 112 of a building 102 and is preferably installed on an exterior building wall 114 facing toward the source of the unwanted magnetic field 218. Preferably, system 100 is installed on all building walls 114. The system 100 may also be installed on the roof 116 and/or the lowest floor (not shown) of the building 102. Accordingly, building 102 may be shielded from unwanted electromagnetic fields 218 from each of walls 114, roof 116 and lowest floor. In this preferred aspect, electromagnetic shielding protection may be provided throughout the entire building volume. While the system 100 is described herein as being installed on an existing building, it is contemplated that the system 100 can also be included as part of a new building construction.

The system 100 includes a plurality of shielding modules 122 that are positioned relative to an exterior surface 112 of the structure or building 102 to be protected. Preferably, the shielding modules are positioned in rows and columns about the exterior surface 112 for providing generally uniform electromagnetic shielding protection across each protected exterior surface of building 102. Each shielding module of the plurality of shielding modules 122 includes a shielding coil 128 positioned around a sensor 124. Each sensor 124 is configured to measure an external electromagnetic field at the location of the sensor 124 and generate a signal based on the measured electromagnetic field. Preferably, the sensors 124 measure at least one of a magnitude and direction of the external electromagnetic field. The signal from each of the sensors 124 is sent to a central control unit 130 positioned on or in the building 102. The central control unit 130 analyses the signal from each sensor 124 and controls the supply of response currents sent to the corresponding shielding coil 128 to generate a counteracting electromagnetic field that at least partially cancels the external electromagnetic field surrounding the shielding coil 128. A counteracting electromagnetic field is generated at each shielding module 122 of the plurality of shielding modules to provide uniform electromagnetic shielding across the protected volume of the building. Preferably, the sensors 124 measure the external electromagnetic field continuously and generate signals continuously based on the measured external electromagnetic field. Likewise, it is preferred that the counteracting electromagnetic field is radiated continuously in response to the continuously generated signals from continuous measurement of the external electromagnetic field. Also, it is preferable that the counteracting electromagnetic field is substantially equal in magnitude to the magnitude of the external electromagnetic field. Likewise, it is preferred that the counteracting electromagnetic field is radiated in an opposite direction to the external electromagnetic field.

Figure 3:
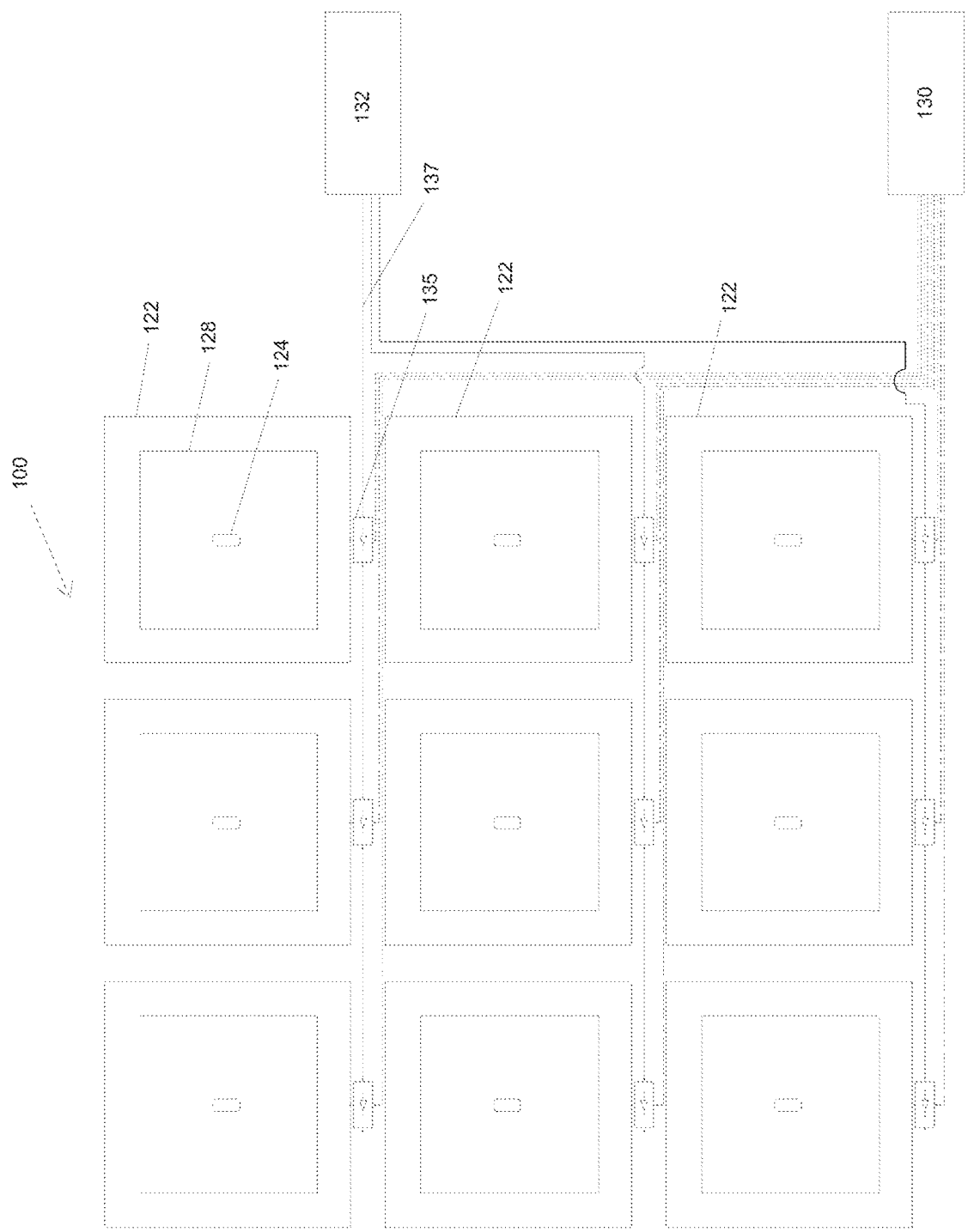
FIG. 3 is a block diagram illustrating the components of the system of FIG. 1.

The system 100 is described in detail below with further reference to FIG. 3 which illustrates a block diagram of the components of the system for shielding large structures from unwanted electromagnetic interference fields in accordance with an aspect of the present disclosure. As shown in FIG. 3, shielding modules 122 include a sensor 124 and a shielding coil 128 surrounding the sensor 124. In one aspect, the sensors 124 are positioned approximately at the center of the corresponding shielding coils 128.

The sensors 124 may be a precision magnetic field sensor, such as flux gate sensor, hall effect type sensor, or another suitable type of magnetic field sensor. The sensors 124 measure at least one of a magnitude and a direction of the electromagnetic field at each shielding module 122 of the plurality of shielding modules and provide information on the orientation and strength of the intrusive electromagnetic field at the location of each sensor 124 in real time. The sensors 124 further generate electrical signals based on the measurement of the at least one of the magnitude and the direction of electromagnetic field at the location of each of the sensors 124 in real-time.

The system 100 further includes a central control unit 130 that is connected to each of the plurality of shielding modules 122. The central control unit 130 is configured to receive the signal information from each of the sensors 124. The signal data from each of the sensors 124 is analyzed in the central control unit 130 in real-time and compensatory currents are sent, in real-time, to the respective shielding coils 128 to mitigate or substantially prevent passage of the intrusive electromagnetic field into the protected volume. The magnitude of the compensatory currents sent to each of the shielding coils depends on the strength and magnitude of the intrusive magnetic field measured at the respective sensor locations. In one aspect of the present disclosure, the central control unit 130 may be configured to analyze at least some of the sensor data and respond to the varying magnetic field using artificial intelligence-based algorithms and machine learning.

In one aspect, the shielding coil 128 of each of the plurality of shielding modules 122 is connected to a respective coil power supply unit 135 for providing response currents to the shielding coils 128 from a central power source 132. Each of the coil power supply units 135 is connected to the central power supply 132 via a common bus (feed) 137. The common bus 137 from the central power source 132 to each of the plurality of coil power supply units 135 may be in a coaxial arrangement to reduce any intrusion of the electromagnetic field associated with the current carried by the common bus into the protected volume. Each of the coil power supply units 135 is also in communication with the central control unit 130 that provides instructions to each of the plurality of coil power supply units 135 to send a response current to each of the respective plurality of shielding coils 128 in response to each signal obtained from the respective plurality of the sensors 124 located in each of the shielding modules 122 to generate a counteracting electromagnetic field that reduces or cancels penetration of the intrusive electromagnetic field inside of the protected volume.

The system 100 can be mounted on any building surface or other location facing the source of the intrusive electromagnetic field. The system can also be mounted on other surfaces including the sides of the building not facing the source of the electromagnetic field, the roof and lowest floor of the building to further reduce penetration of the intrusive electromagnetic field into the building. The system 100 can also be installed on other structures or around other volumes located in the vicinity of electrified railroad tracks such as a children's playground, a school yard, or train passenger platforms to mitigate the intrusive electromagnetic fields generated by the passing on an electric train. As the electromagnetic field originating from passing electric trains and/or railroads may be variable in time and space, effective mitigation of the intrusive electromagnetic fields can be achieved by using a system comprised of individual compensating or shielding modules, small enough to be able to respond to the moving/changing magnetic field disturbance in real time.

Figure 4A:
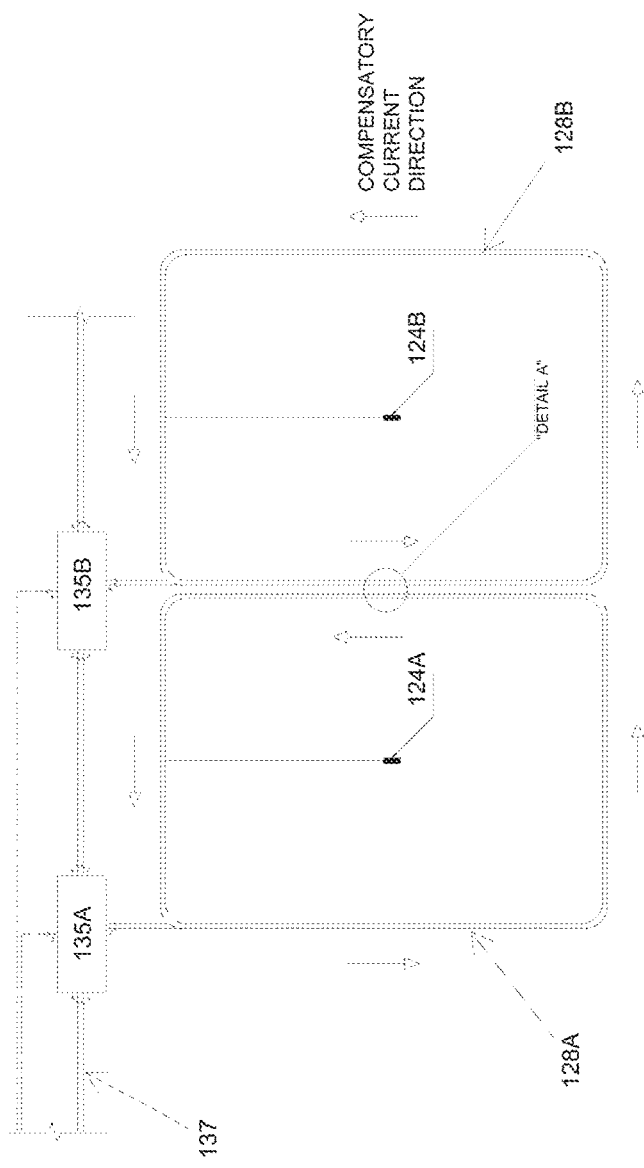
FIG. 4A is a diagram illustrating an arrangement of the shielding coils in accordance with one aspect of the present disclosure.
Figure 4B:
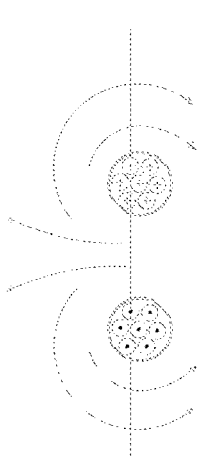
FIG. 4B is a sectional view of the shielding coils shown in FIG. 4A taken at Detail A in FIG. 4A.

FIGS. 4A to 7B illustrate arrangements of the shielding coils on a surface of a structure, building or volume to be protected from intrusive electromagnetic fields. In one aspect, as illustrated in FIGS. 4A and 4B, adjacent shielding coils 128A and 128B can be positioned in rows and columns about the exterior surface 112 of a building 102. Shielding coils 128A and 128B are positioned around field sensors 124A and 124B, respectively. Preferably, magnetic field sensors 124A and 124B are positioned approximately in the center of the shielding coils 128A and 128B, respectively. The shielding coils 128A, 128B are connected to respective coil power supply units 135A, 135B. Each coil power supply unit 135 is connected to a central power source 132 via a common bus 137. Based on the signal received from the magnetic field sensors 124A, 124B, the central control unit 132 directs the respective coil power supply unit 135A, 135B to allow the appropriate amount of response current from the central power source 132 to flow through the respective shielding coil 128A, 128B. The arrows indicate the direction of the flow of the compensatory current flowing through the shielding coils 128A, 128B. The common bus 137 from the central power source 132 to each of the plurality of coil power supply units 135A, 135B may be a coaxial power feed to reduce any intrusion of the counteracting electromagnetic field generated by the shielding coils into the protected volume 113.

Figure 5A:
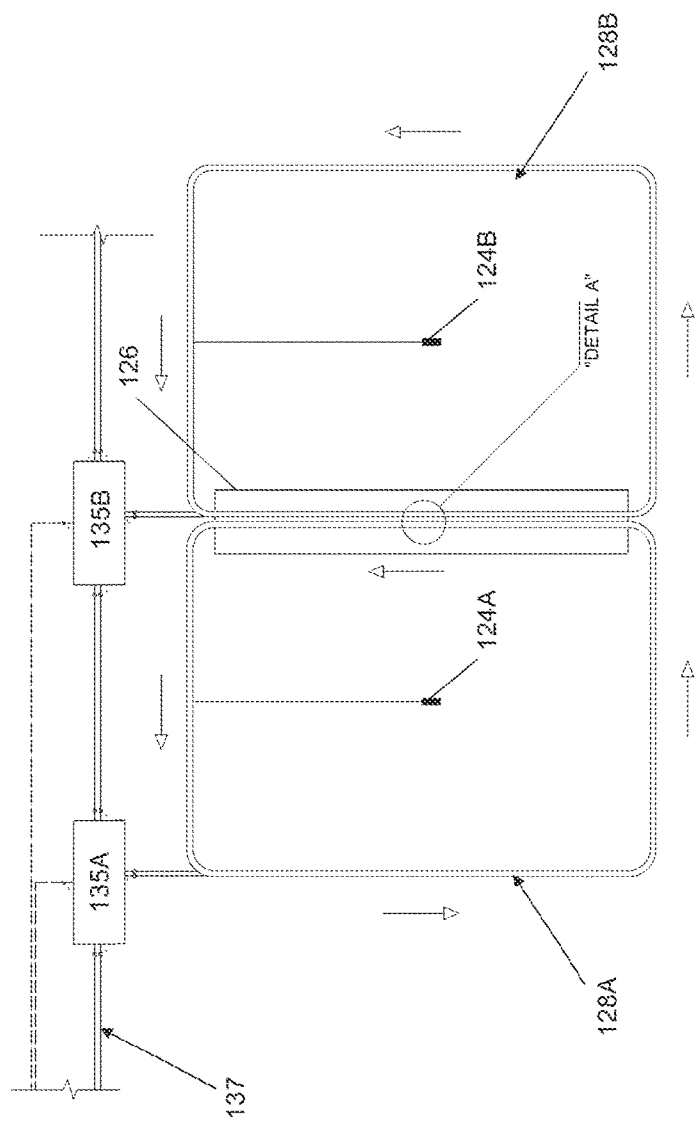
FIG. 5A is a diagram illustrating an arrangement of the shielding coils in accordance with one aspect of the present disclosure.
Figure 5B:
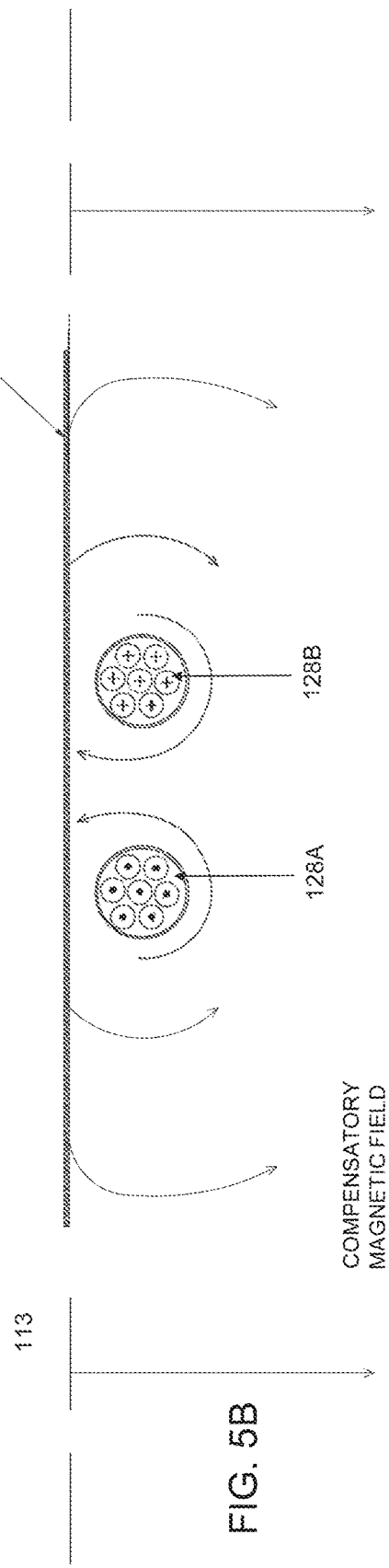
FIG. 5B is a sectional view of the shielding coils shown in FIG. 5A taken at Detail A in FIG. 5A.

In another aspect, as illustrated in FIGS. 5A and 5B, the shielding coils 128A and 128B may be mounted on a ferromagnetic back plate 126 to direct the return path of the compensatory magnetic field away from the protected volume or an interior 113 of the building 102. The ferromagnetic back plate 126 is resistant to passage of electromagnetic radiation therethrough and acts as a magnetic field reflector or deflector and may significantly prevent stray shielding coil magnetic fields from penetrating into the interior of the building 102. The ferromagnetic back plate 126 is especially advantageous in preventing magnetic field intrusion into the protected volume or interior 113 of the building 102 through any gaps which may be present between the adjacent shielding coils 128A and 128B. In one aspect, the ferromagnetic back plate 126 can be positioned in a window frame of the building 102 being shielded so that the window is not obstructed by the back plate 126. In a preferred aspect, the common bus 137 from the central power source 132 to each of the plurality of coil power supply units 135A, 135B may be a coaxial power feed to further reduce any intrusion of the counteracting electromagnetic field generated by the shielding coils into the protected volume 113.

FIGS. 6A and 6B illustrates another arrangement of the adjacent shielding coils 128A, 128B wherein legs 129A, 129B of the adjacent shielding coils 128A, 128B are arranged coaxially to reduce the intrusion of the counteracting electromagnetic field generated by the shielding coils into the protected volume or the interior 113 of the building 102. As shown in FIG. 6B, adjacent legs 129A, 129B of the respective shielding coils 128A, 128B are in a coaxial arrangement with one of the shielding coils 128A, 128B forming an external conductor and the other shielding coil forming an internal conductor. The coaxial or concentric arrangements of the adjacent legs 129A, 129B of the adjacent shielding coils 128A, 128B increases the homogeneity of the shielding coil response to the intrusive electromagnetic field. If the currents in each of the adjacent shielding coils 128A, 128B is substantially equal, there will theoretically be little or no back flow electromagnetic field from the compensatory current in the adjacent coil legs. In a preferred embodiment, the common bus 137 from the central power source 132 to each of the plurality of coil power supply units 135A, 135B may be a coaxial power feed to further reduce any intrusion of the counteracting electromagnetic field generated by the shielding coils into the protected volume 113.

Figure 7A:
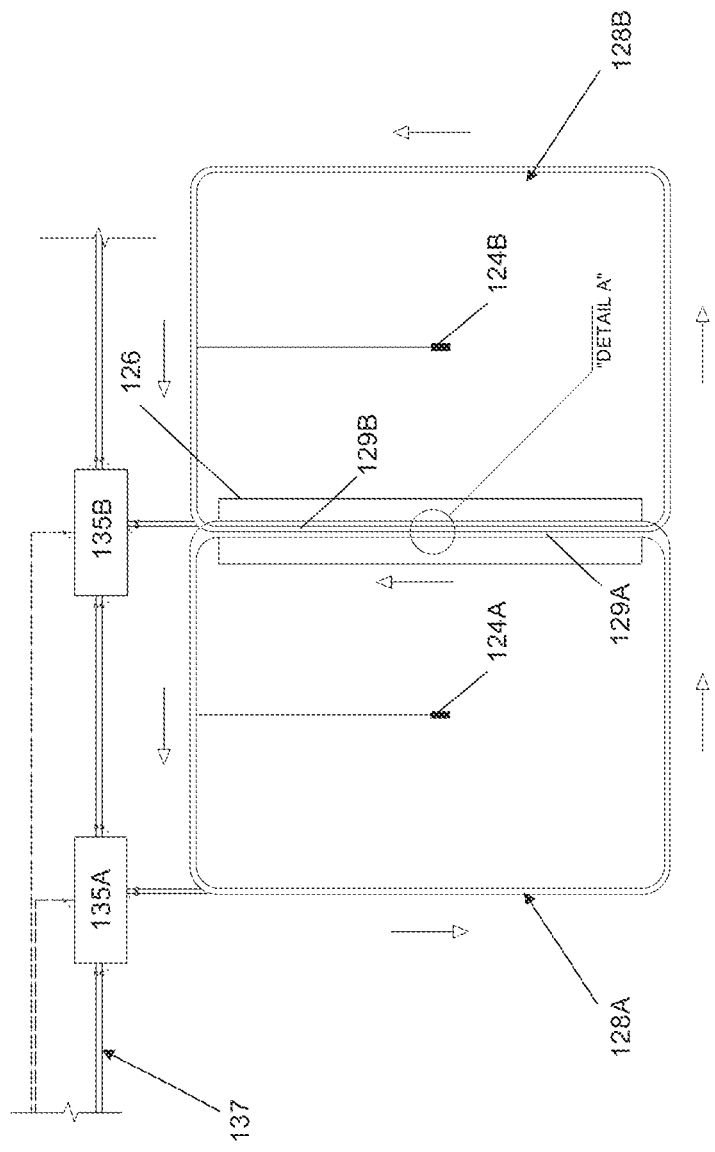
FIG. 7A is a diagram illustrating an arrangement of the shielding coils in accordance with one aspect of the present disclosure.
Figure 7B:
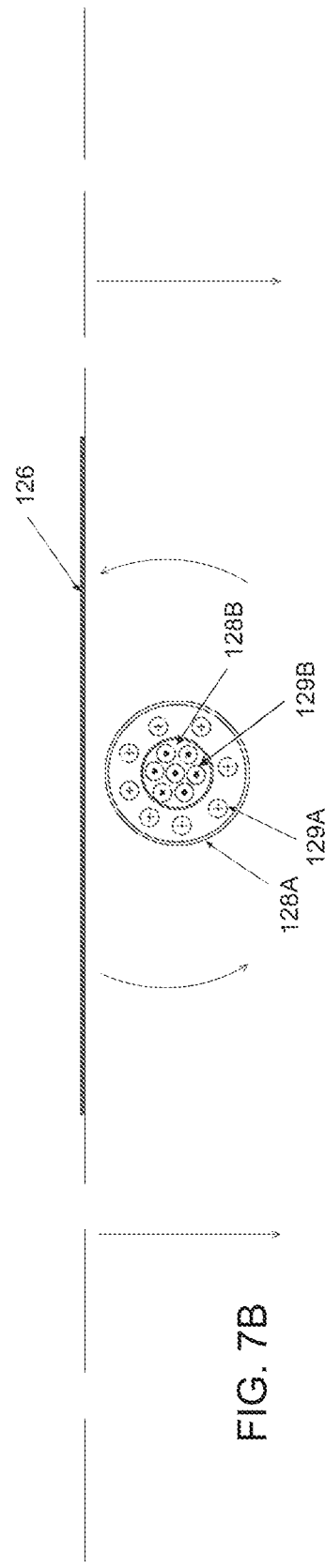
FIG. 7B is a sectional view of the shielding coils shown in FIG. 7A taken at Detail A in FIG. 7A.

In the aspect shown in FIGS. 7A and 7B, still another arrangement of the adjacent shielding coils 128A and 128B is illustrated with leg 129A of shielding coil 128A positioned adjacent to coil leg 129B of shielding coil 128B. The adjacent shielding coils 128A and 128B are mounted on a ferromagnetic back plate 126 and the adjacent legs 129A, 129B of the respective adjacent shielding coils 128A, 128B are arranged coaxially to direct the return path of the compensatory currents away from the protected volume or an interior of the building 102. The combination of the coaxial arrangement of the adjacent legs 129A, 129B from the respective adjacent shielding coils 128A, 128B along with the ferromagnetic back plate provides for a highly uniform compensatory coil response with very low back flow electromagnetic field from the compensatory current into the protected volume. This arrangement provides a very high degree of intrusive magnetic field attenuation in the protected volume 113. In a preferred aspect, the common bus 137 from the central power source 132 to each of the plurality of coil power supply units 135A, 135B may be a coaxial power feed to further reduce any intrusion of the counteracting electromagnetic field generated by the shielding coils into the protected volume 113.

Figure 8:
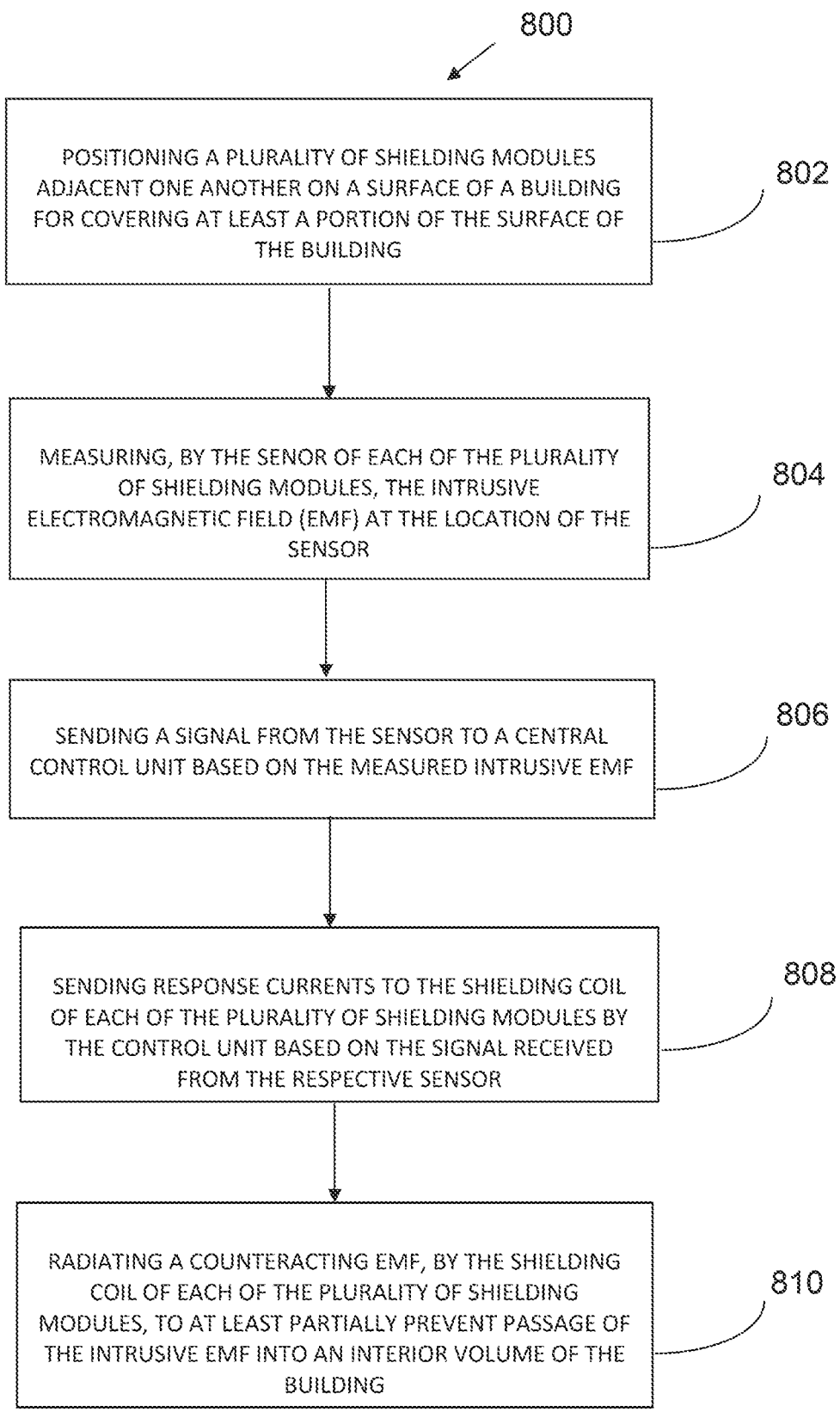
FIG. 8 is a flow chart illustrating a method in accordance with one aspect of the present disclosure.

FIG. 8 is a flowchart illustrating a method 800 for shielding a building from intrusive electromagnetic fields originating from electrified railroads in the vicinity of the building. Electromagnetic fields originating from passing electric trains and/or railroads may be variable in time and space. To effectively counteract or attenuate these spatially variant and time variant electromagnetic fields, the method 800 relies on a sectionalized system comprising of a plurality of shielding modules, each shielding module including shielding coils and field sensors in communication with a central control unit.

In a first step 802, the method 800 comprises positioning a system for shielding a building from intrusive electromagnetic fields relative to a surface of the building. In one aspect, the system for shielding a building from intrusive electromagnetic fields may be the system 100 described above with reference to FIGS. 1 to 7B. The system 100 includes a plurality of shielding modules 122 with each of the plurality of shielding modules 122 comprising a shielding coil 128 positioned around a sensor 124. Preferably, the sensor 124 is positioned approximately at the center of the shielding coil 128 of each of the plurality of shielding modules 122. The system also includes a central control unit 130 in communication with each of the plurality of shielding modules 122. Step 802 includes positioning the plurality of shielding modules 122 of the system 100 adjacent one another on a surface of the building 102 for covering at least a portion of the surface of the building 102.

At step 804, the sensor 124 of each of the plurality of shielding modules 122 detects and measures the intrusive electromagnetic field detected at the location of the sensor 124.

At step 806, the sensor 124 of each of the plurality of shielding modules 122 sends a signal to the central control unit 130 based on the measured electromagnetic field detected by the sensor 124.

At step 808, the central control unit 130 sends a response current to the shielding coil 128 of each of the plurality of shielding modules 122 based on the signal received from the respective sensor 124.

At step 810, the shielding coil 128 of each of the plurality of shielding modules 122 modules radiates a counteracting electromagnetic field that at least partially prevents passage of the intrusive electromagnetic field into an interior volume of the building. As the response current sent to each shielding coil is dependent on the signal from the sensor at that location, the resultant magnetic field generated around the protected building counteracts or mitigates the intrusive electromagnetic field at that location in real time while limiting over-compensation and under-compensation.

While the method 800 is described above for protecting a building against intrusive electromagnetic fields from electrified railroads, it can also be used for shielding a building from any time variant and/or space variant magnetic fields. The method can also be used for shielding other volumes such as other large structures, such as commercial buildings, playgrounds and/or school yards.

While the invention has been described in terms of specific aspects, it is apparent that other forms could be adopted by one skilled in the art. For example, the methods described herein could be performed in a manner which differs from the embodiments described herein. The steps of each method could be performed using similar steps or steps producing the same result, but which are not necessarily equivalent to the steps described herein. Some steps may also be performed in different order to obtain the same result. Similarly, the apparatuses and systems described herein could differ in appearance and construction from the aspects described herein, the functions of each component of the apparatus could be performed by components of different construction but capable of a similar though not necessarily equivalent function, and appropriate materials could be substituted for those noted. Accordingly, it should be understood that the invention is not limited to the specific aspects described herein. It should also be understood that the phraseology and terminology employed above are for the purpose of disclosing the illustrated aspects, and do not necessarily serve as limitations to the scope of the invention.

What is claimed is:

1. A system for at least partially preventing passage of an intrusive electromagnetic field into an internal volume of a structure, the system comprising:
   a plurality of shielding modules positionable adjacent one another on an exterior surface of the structure for covering at least a portion of the exterior surface of the structure, each of the plurality of shielding modules comprising:
      a sensor configured to continuously measure the intrusive electromagnetic field at a location of the sensor and continuously generate a signal based on the continuously measured intrusive electromagnetic field; and
      a shielding coil positioned around the sensor and mounted on a ferromagnetic back plate resistant to passage of electromagnetic field radiation therethrough; and,
   a central control unit in communication with each of the plurality of shielding modules, the central control unit configured to continuously control supply of response currents to the shielding coil of each of the plurality of shielding modules based on the signal received from a respective sensor such that the shielding coil of each of the plurality of shielding modules continuously radiates a counteracting electromagnetic field that at least partially prevents passage of the intrusive electromagnetic field into the internal volume of the structure.

2. The system of claim 1, wherein the plurality of shielding modules comprises:
   a first shielding module, the first shielding module comprising a first shielding coil having a first leg; and
   a second shielding module, the second shielding module comprising a second shielding coil having a second leg;
   wherein the first shielding coil is positionable adjacent to the second shielding coil such that the first leg of the first shielding coil and the second leg of the second shielding coil are arranged coaxially.

3. The system of claim 1, wherein the shielding coil of each of the plurality of shielding modules is connected to a respective coil power supply unit; and wherein, in response to instructions from the central control unit, the respective coil power supply unit supplies the response currents to the shielding coil.

4. The system of claim 1, wherein the counteracting electromagnetic field is substantially equal in magnitude to the intrusive electromagnetic field; and wherein the counteracting electromagnetic field is radiated in an opposite direction to the intrusive electromagnetic field.

5. The system of claim 1, wherein the structure is a building, and wherein the plurality of shielding modules is positionable on at least one of a wall, a roof, and a lowest floor of the building.

6. The system of claim 5, wherein the intrusive electromagnetic field measured by each shielding module of the plurality of shielding modules originates from at least one electric system in proximity of the building.

7. The system of claim 1, wherein the sensor is a flux-gate sensor or a Hall-effect sensor.

8. The system of claim 1, wherein the sensor is positioned at a center of the shielding coil.

9. A system for shielding a building from an intrusive electromagnetic field, the system comprising:
   a plurality of shielding modules positioned on a wall of the building adjacent one another for covering at least a portion of the wall of the building, each of the plurality of shielding modules comprising:
      a sensor configured to continuously measure the intrusive electromagnetic field at a location of the sensor and continuously generate a signal based on the continuously measured intrusive electromagnetic field; and,
      a shielding coil positioned around the sensor and mounted on a ferromagnetic back plate resistant to passage of electromagnetic field radiation therethrough; and
   a central control unit positioned on the building and in communication with each of the plurality of shielding modules, the central control unit configured to continuously control supply of response currents to the shielding coil of each of the plurality of shielding modules based on the signal received from a respective sensor such that the shielding coil of each of the plurality of shielding modules continuously radiates a counteracting electromagnetic field that at least partially prevents passage of the intrusive electromagnetic field into an interior volume of the building.

10. The system of claim 9, wherein the plurality of shielding modules comprises:
a first shielding module, the first shielding module comprising a first shielding coil having a first leg; and
a second shielding module, the second shielding module comprising a second shielding coil having a second leg;
wherein the first shielding coil is positioned adjacent to the second shielding coil such that the first leg of the first shielding coil and the second leg of the second shielding coil are arranged coaxially.

11. The system of claim 9, wherein the plurality of shielding modules is further positioned on at least one of a second wall, a roof, and a lowest floor of the building.

12. The system of claim 9, wherein the shielding coil of each of the plurality of shielding modules is connected to a respective coil power supply unit; and wherein, in response to instructions from the central control unit, the respective coil power supply unit supplies the response currents to the shielding coil.

13. The system of claim 9, wherein the sensor is configured to measure at least one of a magnitude and a direction of the intrusive electromagnetic field and generate the signal based on the measured at least one of the magnitude and the direction in real-time.

14. The system of claim 9, wherein the central control unit is configured to control the supply of the response currents to the shielding coil of each of the plurality of shielding modules in real-time.

15. The system of claim 9, wherein the intrusive electromagnetic field measured by the sensor of each of the plurality of shielding modules originates from at least one electric system in proximity of the building.

16. A method for shielding a building from intrusive electromagnetic fields, the method comprising:
positioning a plurality of shielding modules adjacent one another on a surface of the building for covering at least a portion of the surface of the building, each of the plurality of shielding modules comprising a shielding coil positioned around a sensor and mounted on a ferromagnetic back plate resistant to passage of electromagnetic field radiation therethrough;
continuously measuring, by the sensor of each of the plurality of shielding modules, the intrusive electromagnetic field at a location of the sensor;
sending a signal from the sensor to a central control unit based on the continuously measured intrusive electromagnetic field; and
continuously sending a response current to the shielding coil of each of the plurality of shielding modules based on the signal received from a respective sensor such that the shielding coil of each of the plurality of shielding modules continuously radiates a counteracting electromagnetic field that at least partially prevents passage of the intrusive electromagnetic field into an interior volume of the building.

17. A system for at least partially preventing passage of an intrusive electromagnetic field into an internal volume of a structure, the system comprising:
a plurality of shielding modules positionable adjacent one another on an exterior surface of the structure for covering at least a portion of the exterior surface of the structure, each of the plurality of shielding modules comprising:
a sensor configured to continuously measure the intrusive electromagnetic field at a location of the sensor and continuously generate a signal based on the continuously measured intrusive electromagnetic field; and
a shielding coil positioned around the sensor; and,
a central control unit in communication with each of the plurality of shielding modules, the central control unit configured to continuously control supply of response currents to the shielding coil of each of the plurality of shielding modules based on the signal received from a respective sensor such that the shielding coil of each of the plurality of shielding modules continuously radiates a counteracting electromagnetic field that at least partially prevents passage of the intrusive electromagnetic field into the internal volume of the structure;
wherein the plurality of shielding modules comprises:
a first shielding module, the first shielding module comprising a first shielding coil having a first leg; and
a second shielding module, the second shielding module comprising a second shielding coil having a second leg;
wherein the first shielding coil is positionable adjacent to the second shielding coil such that the first leg of the first shielding coil and the second leg of the second shielding coil are arranged coaxially.

18. A system for shielding a building from an intrusive electromagnetic field, the system comprising:
a plurality of shielding modules positioned on a wall of the building adjacent one another for covering at least a portion of the wall of the building, each of the plurality of shielding modules comprising:
a sensor configured to continuously measure the intrusive electromagnetic field at a location of the sensor and continuously generate a signal based on the continuously measured intrusive electromagnetic field; and,
a shielding coil positioned around the sensor; and
a central control unit positioned on the building and in communication with each of the plurality of shielding modules, the central control unit configured to continuously control supply of response currents to the shielding coil of each of the plurality of shielding modules based on the signal received from a respective sensor such that the shielding coil of each of the plurality of shielding modules continuously radiates a counteracting electromagnetic field that at least partially prevents passage of the intrusive electromagnetic field into an interior volume of the building;
wherein the plurality of shielding modules comprises:
a first shielding module, the first shielding module comprising a first shielding coil having a first leg; and
a second shielding module, the second shielding module comprising a second shielding coil having a second leg;
wherein the first shielding coil is positioned adjacent to the second shielding coil such that the first leg of the first shielding coil and the second leg of the second shielding coil are arranged coaxially.

* * * * *